April 11, 1967 J. T. LAST 3,313,013

METHOD OF MAKING SOLID-STATE CIRCUITRY

Original Filed Aug. 15, 1960 2 Sheets-Sheet 1

INVENTOR.
JAY T. LAST
BY Roger A. Borovoy
ATTORNEYS

April 11, 1967 J. T. LAST 3,313,013

METHOD OF MAKING SOLID-STATE CIRCUITRY

Original Filed Aug. 15, 1960 2 Sheets-Sheet 2

INVENTOR.
JAY T. LAST
BY Roger S. Borovoy
ATTORNEYS

United States Patent Office 3,313,013
Patented Apr. 11, 1967

3,313,013
METHOD OF MAKING SOLID-STATE CIRCUITRY

Jay T. Last, Los Altos, Calif., assignor to Fairchild Camera and Instrument Corporation, Syosset, N.Y., a corporation of Delaware Original application Aug. 15, 1960, Ser. No. 49,717, now Patent No. 3,158,788, dated Nov. 24, 1964. Divided and this application Oct. 5, 1964, Ser. No. 401,540
6 Claims. (Cl. 29—25.3)

Figure 1:
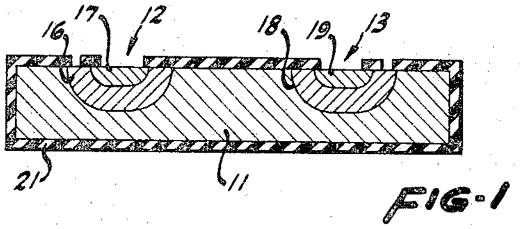
Figure 2:
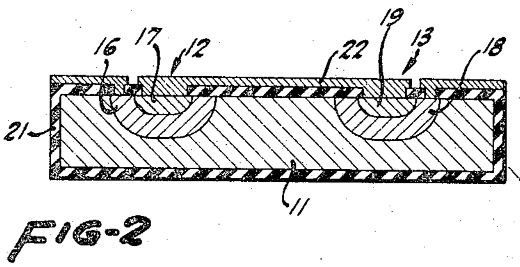

The present invention relates to an improvement in the isolation of components in solid-state circuits. There is particularly provided hereby an improvement in the process of manufacturing solid-state circuits embodying a plurality of circuit elements in a single, physical component wherein the processing steps are simplified, and there is yet achieved an improved solid-state circuit configuration. This application is a divisional application of application Ser. No. 49,717, filed Aug. 15, 1960, now Pat. No. 3,158,788.

Although the desirability and practicability of solid-state circuits are well recognized, the problems of providing requisite isolation between separate circuit components in a single, physical unit and desired electrical connections between individual portions thereof pose serious obstacles to the attainment of the truly generic approach thereto. While various electronic circuits are relatively well suited for incorporation in a single, solid-state unit, other electronic circuits are not so readily manufactured in this form. Many electronic circuits require such a high degree of electrical isolation between components thereof that conventional solid-state processing is inapplicable to produce solid-state circuits therefrom. One approach to this problem has been the provision of separate solid-state components which are closely joined together into a relatively miniaturized package. It will be appreciated that this is, at best, a partial solution to the problem and fails to provide many of the advantages desired from solid-state circuits.

One of the major difficulties encountered in the manufacture of solid-state circuits is the necessity for extremely precise registration at various stages of manufacture. Multiple processing operations, which require moving of the semiconducting crystal wafer between separate steps thereof, magnifies this registration problem so that it becomes almost impossible to accomplish the steps at the latter stage of the process with the requisite degree of accuracy. Thus, for example, the attachment of electrical leads to individual transistor components of a solid-state circuit necessitates a very precise placement of same upon the circuit unit, and attempts to accomplish this at the latter stages of a manufacturing process, wherein the unit has been necessarily moved a number of times during the process, results in a high degree of faults or failures in the resulting units.

The present invention provides for the establishment in a single, solid-state unit of a plurality of electronic components, in accordance with known transistor manufacturing procedures, followed by the establishment of requisite electrical connections to such electronic components, and between individual portions thereof as required for attainment of a desired circuit configuration. This is accomplished with the circuit components relatively unisolated in the crystal wafer. The invention hereof then provides for the establishment of electrical isolation or insulation between the circuit components without disturbing the components themselves or the electrical connections therebetween. It is possible to carry out the process of the present invention with conventional semiconductor processing equipment, and without modification of recognized processing techniques, so that the process hereof is admirably suited for utilization in existing manufacturing facilities. There is provided herein, however, the material advantage of attaining a maximized electrical isolation between components of a solid-state circuit, and also the simplification of processing requirements specifically in connection with the alinement or registry between the solid-state circuit wafer or unit and manufacturing facilities employed to operate thereon.

Briefly, the improved process of making solid-state electronic circuits of this invention comprises the steps of: forming a plurality of semiconductor devices in a single wafer of semiconducting material having PN junctions extending to a surface of the wafer and having an insulating protective coating upon the wafer surface at least over the rectifying junctions and extending between the devices, forming conductive electrical interconnections between regions of different ones of the devices adjacent the protective coating by the steps of forming openings in the insulating coating communicating with separate regions of the semiconductor devices in the wafer, depositing conductive electrical interconnections upon the surface of the wafer over the coating and extending through the openings into ohmic contact with said separate regions, and etching at least one channel entirely through the semiconducting material of the wafer from the opposite surface thereof, thereby providing electrical isolation between devices on opposite sides of the channel.

Figure 7:
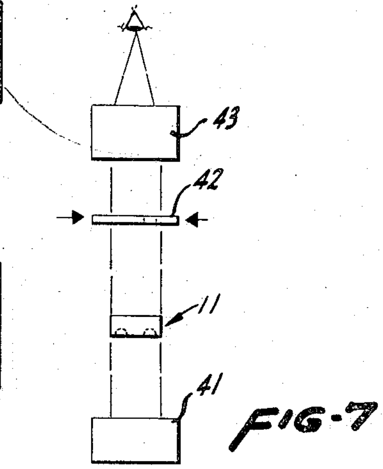
Figure 3:
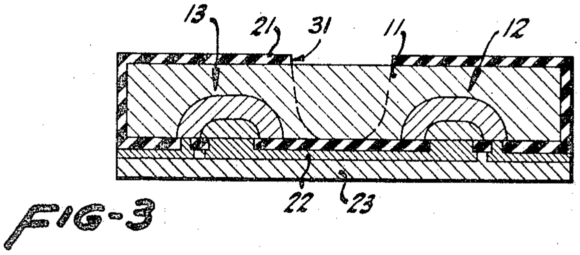
Figure 8:
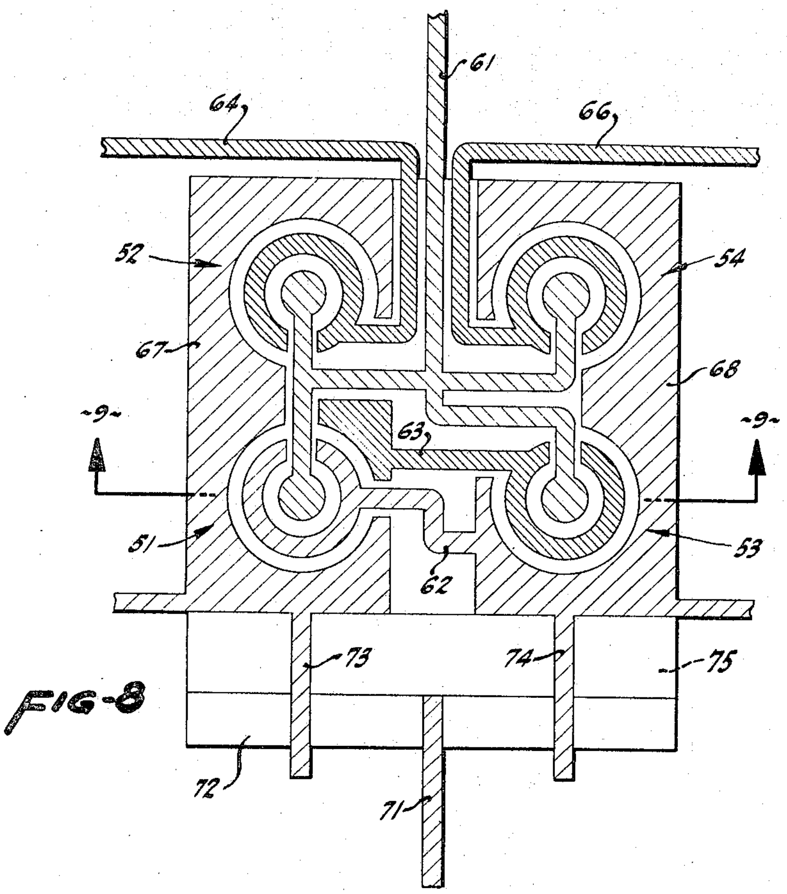
Figure 9:
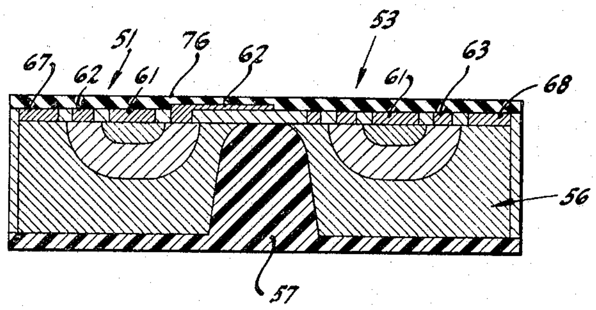

The present invention is illustrated as to the improved process thereof, and the improved semiconductor circuit complex in the accompanying drawings, wherein:

FIGS. 1–6 illustrate the improved solid-state circuit complex hereof at various stages of manufacture, in accordance with the process of the present invention;

FIG. 7 schematically illustrates a method of optically alining the semiconductor wafer at the stage of the manufacture wherein same is inverted;

FIG. 8 is a plan view of a solid-state circuit formed in accordance with the present invention; and FIG. 9 is a sectional view through the solid-state unit of FIG. 8, taken in the plane 9—9 of such figure.

The present invention is directed to an improved process of manufacturing solid-state electronic circuits and to an improved solid-state device comprising a complete circuit. Various possible objects and advantages of the present invention will become apparent to those skilled in the art from the following description of preferred steps in the process thereof, and preferred embodiments of the product; however, no limitation is intended by the terms of such descriptive matter, and instead, reference is made to the appended claims for a precise delineation of the true scope of this invention.

Considering first the process hereof, and referring to FIGS. 1 to 6 of the drawings, the manufacture of an improved solid-state electronic circuit, in accordance herewith, includes the initial preparation of a wafer of monocrystalline semiconducting material of requisite purity, in accordance with established procedures. Although a substantial number of circuit complexes may be formed from the single wafer of semiconducting material, the following description is referenced to a single complex in the interests of simplicity of explanation. The individual semiconducting devices forming the components of the circuit complex hereof may be formed, for example, by diffusion of selected impurities into the wafer of material, and through suitable and known control of these diffusion steps it is possible to produce in a single wafer a large plurality of semiconducting devices such as diodes and transistors. The foregoing may follow conventional manufacturing techniques, wherein it is normal to produce a large number of semiconducting devices in a single wafer, and later to separate these into individual circuit components. FIG. 1 illustrates the device or circuit unit in an early stage in the manufacture of the solid-state circuit of this invention, and wherein a wafer 11 is shown with first and second transistors 12 and 13 formed therein, The transistor 12 may be formed by the controlled diffusion of a selected impurity into the front face of the wafer to form a base layer 16 therein, and the subsequent limited diffusion of an impurity of opposite polarity into this base layer to thereby form an emitter layer or dot 17. The wafer itself has a suitable impurity disposed therethrough to impart the desired polarity to the material thereof, so that there is provided in the transistor 12 a pair of rectifying junctions disposed in conventional manner between the separate portions of the transistor. Similarly, the transistor 13 may be formed by the diffusion of an impurity into the wafer to form a base layer 18 and the subsequent diffusion of a further impurity into such base layer to thereby form an emitter 19, so that the portions of this transistor are likewise separated by rectifying transistor junctions. In the course of this manufacturing, it is preferable that the wafer be protected about the exterior surface thereof by a coating 21 serving to protect the surface of the semiconducting material, and also to protect the junctions of the transistor at the points where same emerge upon the upper surface of the wafer. In the instance wherein the solid-state unit is to be formed of silicon semiconducting material, this exterior coating may comprise a silicon oxide which has been found to be highly advantageous in protecting the exterior surface of the wafer. Subsequent to the diffusion of selected impurities into the wafer to form the above-identified transistors 12 and 13 therein, there are formed openings through the protective coating 21 atop the wafer for communication with separate portions of the two transistors, in an order to afford communication thereto for electrical connections. These openings, as shown in FIG. 1, may be produced by suitable controlled etching operations.

Attachment of electrical connections to the circuit elements of the solid-state unit is preferably accomplished by the plating of a suitable metal upon the upper surface of the unit, such that this metal then extends through the openings in the coating 21 about the wafer. Subsequent to the application of this metal coating, same is selectively etched or otherwise removed so as to leave portions thereof extending between desired openings in the coating to, in fact, comprise the equivalent of a printed circuit upon the upper surface of the unit. There will thus be seen in FIG. 2 to be introduced in this manner electrical connections 22 extending over the surface of the protective coating 21, and through the openings therein into electrical ohmic contact with selected regions of the transistors 12 and 13 diffused into the wafer. In this respect, it is particularly noted that the coating 21 must have a high electrical resistance in order to properly isolate the electrical leads 22 from remaining portions of the circuit. All of the steps of the process hereof described to this point may be performed without moving the wafer from which the semiconducting solid-state circuit is to be formed.

Figure 4:
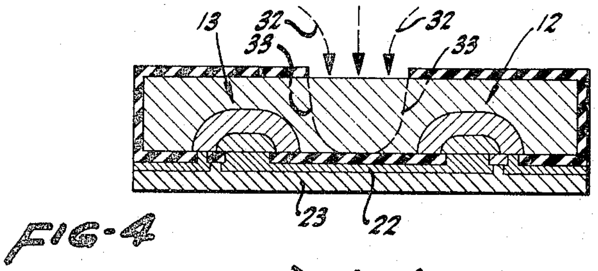
Figure 5:
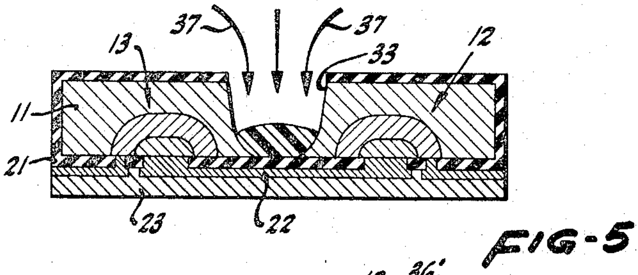

Following the application of the printed electrical connections over the upper surface of the wafer and into electrical contact with selected portions of the transistors formed therein, there is applied a further protective coating 23 over the electrical connections 22, and this may be accomplished by the application of a suitable masking means, such as black wax, upon the upper surface or front face of the wafer, as well as along the edges, if desired. Following the application of this protection to the upper surface of the unit, same is inverted so that the under surface or back face of same is disposed upwardly. This back face is then operated upon in a conventional manner, such as by etching, to form an opening 31 through the protective coating 21 on the wafer. The opening 31 is oriented to lie in line with the space between the semiconducting devices 12 and 13 formed in the wafer. Through this opening 31 there is applied a selective etchant, such as C.P. 8, which operates to relatively rapidly etch through the wafer from the back side thereof to the front. In this respect, it is noted that any of this class of etchants which are rich in nitric acid are selective; C.P. 8 being formed of five parts concentrated nitric acid and three parts concentrated hydrofluoric acid. With regard to the selectivity of the etching operation, it is contemplated in accordance herewith that there shall be etched out a moat or channel extending through the wafer from the back thereof to the front, but not through the protective coating 21 upon the front of the wafer. By known means and methods, it is possible to provide for relatively precise control over etching operations, such as the one herein described; however, herein there is also utilized a selective etchant which operates relatively rapidly on the silicon material of the wafer, and yet relatively slowly on the silicon oxide masking. It will be appreciated that control of the etching of the moat or channel through the wafer is thereby materially simplified. In accordance herewith, the protective coating 21 upon the front face of the wafer, whereat the transistors 12 and 13 are diffused, is maintained intact throughout the process hereof. Likewise, the electrical connections 22 plated upon this front face of the wafer over the protective coating 21 and into electrical connection with different regions of the transistors within the wafer, are maintained intact inasmuch as the etching operation, schematically illustrated in FIG. 4, does not extend beyond the front face of the wafer from the back thereof. As shown in FIG. 4, the etchant is applied, as indicated by the arrows 32, to the back of the wafer which is uppermost following the above-noted inversion of same, and there is consequently etched away the channel, indicated by the dashed lines 33, extending through the wafer from the back thereof to the under side of the protective coating upon the front face of the wafer. It will be appreicated that following this etching step the wafer is divided into separate parts, insofar as semiconducting material is concerned, and furthermore, that the wafer cannot readily stand handling in this condition, inasmuch as the protective coating 21 does not afford substantial mechanical strength to the unit.

Figure 6:
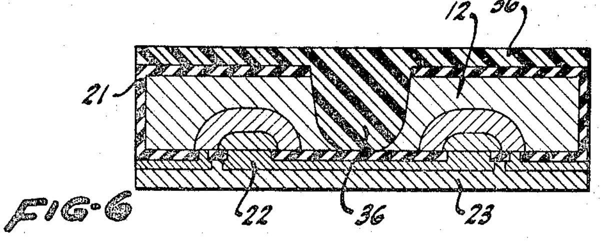

Following the above-described etching of the moat 33 through the wafer, there is applied to the back of the wafer an insulating material 36, preferably in liquid form, so that same flows downwardly into this moat 33, as indicated by the arrows 37, and consequently fills the moat. This insulating material serves a plurality of purposes and may, for example, comprise an epoxy resin. With the filling of the moat 33 with a material such as above suggested, there is provided a very substantial electrical insulation or isolation between the separate portions of the wafer 11, and in particular, between the separate transistors 12 and 13 formed therein. Furthermore, the insulating material used for back fill and identified by the numeral 36, serves to rigidly bond together the various portions of the wafer by refilling the moat 3 therein. With the hardening of the liquid or plastic resin, or the like 36, poured into the moat 33, it will be appreciated that the wafer is again joined together into a single integral unit. Not only are the separate portions of the wafer electrically isolated by the interposed insulation 36, but furthermore, the structural rigidity of the wafer is restored. The structural strength may be even further improved by the application of additional like material 36' upon the back surface of the wafer, as indicated in FIG. 6 of the drawing, and it is to be appreicated that the insulating material 36 has substantially the same coefficient of expansion as the semiconductor.

Following the foregoing steps, the unit is further processed in accordance with relatively conventional manufacturing steps, wherein the wax, for example, is removed and suitable encapsulation is performed. With regard to the protective and insulating coating 21 upon the wafer, it is preferable that same remain thereon, not only during the processes of the present invention, but following same, so as to fully protect the semiconducting material at the surface thereof from contamination during additional manufacturing steps, and also from deterioration or change during the lifetime of the unit.

There has been described above the preferred and improved steps of the process of this invention, wherein there is formed a solid-state circuit from semiconducting material to produce a maximized insulation between separate components of the circuit while yet attaining a truly unitary solid-state device formed of a multiplicity of components. Although the process has been described in simplified form as related to a small wafer and the isolation of only two transistors therein, it will be appreciated that the process is equally applicable to more complicated configurations wherein a larger multiplicity of semiconducting devices and circuit elements are to be isolated within a single unit. By the utilization of selective etching suitably controlled and applied from the back side of the wafer, it will be seen that the unit is at all times maintained in one single piece, and under no circumstances are the separate electronic components thereof physically separated. This is highly advantageous in that very serious difficulties arise from efforts to recombine separate solid-state devices into a single unit. The problems of applying electrical connections to the unit in extension between portions of separate devices therein are minimized herein. Thus, the application of the electrical leads 22 is materially simplified, inasmuch as same are applied immediately following the formation of the separate transistors or diodes within the unit. It is not necessary to employ a multiplicity of operations wherein the unit or wafer is moved from a single spot. This thereby precludes prior-art difficulties of alinement or registration arising from attempts to place the wafer or unit back into exact original position for performing further operations thereon. Inasmuch as the physical dimensions of the individual components of the solid-state circuit hereof are extremely minute, as of the order of some few mils or thousandths of inches, it will be appreciated that the application of electrical connections to same becomes extremely difficult unless exact registration between the manufacturing apparatus and the unit or wafer itself is maintained.

With regard to the location of the opening 31 formed in the back side of the unit prior to the carrying out of selective etching therethrough, it will be appreciated that certain difficulties can arise in this connection, for only a slight variation in lateral placement of such opening could allow the moat or channel 33 etched in the wafer to extend into a portion of one of the transistors 12 or 13 therein. In this respect, attention is invited to FIG. 7 wherein there is schematically illustrated an optical system for precisely locating the desired position of the opening 31 following inversion of the unit. Inasmuch as the transistor junctions of the unit are formed prior to inversion of same, it is possible to employ the known difference in light properties of different types of semiconducting material to the end of precisely locating the position of the opening to be formed in the back side of the unit. Thus, as shown in FIG. 7, there may be provided a light source 41 producing a light beam in the infrared region, for example, with such beam being directed upwardly onto the front of the device which is then lowermost. In accordance with known properties of doped semiconductors, the light will be transmitted in a pattern through the wafer and a preformed mask 42 may be visually alined therewith by a converter 43 producing visible light from incident infrared. The resultant light pattern may then be optically viewed and the mask moved into desired registry therewith for precise definition of the moat location. The above brief description illustrates one possible optical system for identifying the position of the opening 31 to be formed in the coating 21 upon the back side of the unit; however, it is possible to employ other registry means in this respect, such as alternative optical systems.

There is illustrated in FIGS. 8 and 9 one embodiment of the solid-state circuit of the present invention, which may be formed in accordance with the process hereinabove described. A solid-state, flip-flop or multivibrator circuit is shown in FIG. 8, wherein the plane of the figure is taken below the protective covering which may be disposed over the top of the unit. As shown in FIG. 8, there are provided within a single integral unit some four semiconductor devices, illustrated as first pairs of transistors 51, 52, and second pairs of transistors 53 and 54, diffused from the top into a single wafer 56. In this particular instance, the wafer may be formed of N-type silicon, so that a suitable acceptor impurity is diffused into the upper surface at selected points to form the P-type base members of the transistors, and a suitable donor impurity, such as boron, is diffused into limited portions of the upper surface of such base layers to thereby form the transistor emitters. In this instance then, the main portion of the wafer comprises the collector elements of the transistors. In this particular circuit, the pairs of transistors 51, 52, and 53, 54 have the collectors of each pair electrically joined so that it is not necessary to electrically isolate or insulate between same. Thus, in this instance the integral plastic insulator 57, as shown in FIG. 9, extends transversely through the wafer to separate the pairs of transistors and no provision is made for separating the collectors of the transistors of each pair. P-N junctions of the transistors electrically isolate the other portions of the transistors of each pair from each other. Upon the upper surface of the unit there are provided electrical connections which may, for example, be plated upon same in the manner described above or, alternatively, may be affixed thereto in some other more conventional manner. The particular electrical connections shown are of the type disclosed in copending patent application Ser. No. 830,507, now Pat. No. 2,981,877, entitled "Semiconductor Device and Lead Structure," filed by Robert N. Noyce and assigned to same assignee as the present application. The unit of FIG. 8 hereof will be seen to provide common electrical connections 61 between the emitters of each of the transistors. The base of the transistor 51 is connected by a lead 62 to the collectors of the transistors 53 and 54, while the base of the transistor 53 is connected by lead 63 to the collectors of the first pair of transistors 51 and 52. The base members of the transistors 52 and 54 are connected by separate leads 64 and 66, respectively, to external terminals of the device, and likewise, separate conductors 67 and 68 provide common collector connections of the transistors of the first and second pairs thereof, respectively, and extend therefrom for external connection. In addition to the plurality of semiconductor devices which are provided in the wafer, there may also be provided passive circuit components. Thus, there is shown a resistor 72 which may be diffused into or plated upon the wafer and which is separated from the remainder of the unit by a non-conducting transverse barrier 75 of the type described above. A power supply lead 71 connects to the resistor at a central point thereon, and a pair of leads 73 and 74 extend from the resistor ends to collector connections 67 and 68.

It will be seen from the illustration of FIGS. 8 and 9 that the pairs of transistors are completely isolated from each other by the barrier of insulating material 57, with the sole interconnection of transistor elements being provided by electrical leads, as identified above, extending across the insulating coating upon the upper surface of the solid-state unit. Likewise, the resistor 72 of the circuit is included as an integral part of the single physical unit. An additional protective coating 76 may be placed over the front face and electrical connections of the unit, as shown in FIG. 9. Relatively extensive ohmic contacts are made to the collector elements of the transistors, and the particular unit pictured in these figures may have a width across the electrical connection upon the transistor collectors of about 32 mils or 32/1000 of an inch, while the dimension longitudinally of the figure between the outer edges of the collector connections may measure about 34 mils. This minute unit performs the functions of four electronic circuit devices, such as vacuum tubes, or separate transistors, and does not require the interconnection of minute transistor elements or other circuit elements, as is necessary in more conventional circuit construction. Not only does the solid-state circuit unit pictured in FIGS. 8 and 9 provide the advantages desired and hoped for of solid-state circuitry, but furthermore, this unit has a substantial structural strength, and by virtue of the manner of isolation between the separate portions thereof, as is required of the circuit, same is highly reproducible with a very low incidence of rejection during manufacture.

The unitary solid-state circuit of the present invention will be seen to comprise a single integral element embodying both semiconducting material of desired properties in particular relationships, together with a bonded insulating material such as an epoxy resin, which affords the necessary electrical insulation between elements, as well as a highly desirable structural strength and rigidity to the resultant unit. The method of the present invention provides a highly practical manner of producing a solid-state circuit having the attributes sought after in the art. In accordance with the method hereof, the difficulties of multiple handling, as well as registry of minute elements with manufacturing equipment, is minimized, so as to thereby attain extreme accuracy at a reduced cost. This results not only in an improved result, but also in a minimization of the failures during processing, so as to thereby even further commend the process hereof to commercial manufacture.

What is claimed is:

1. An improved process of manufacturing solid-state electronic circuits comprising forming a plurality of junction-type semiconductor devices adjacent the surface of a single wafer of semiconducting material, forming an insulating protective coating upon the wafer surface whereat rectifying junctions of the devices emerge and extending between the devices, etching at least one channel through the wafer from a back side thereof to, but not through said protective coating intermediate the devices, and filling said channels with an insulating material while bonding same to the wafer to rejoin the portions of the wafer proper and provide electrical isolation between portions of the wafer separated by said insulation.

2. A process as set forth in claim 1, further defined by said etching being carried out with an etchant which dissolves wafer material much faster than the material of the protective coating.

3. An improved process of manufacturing solid-state electronic circuits comprising the steps of forming a plurality of semiconductor devices in different portions adjacent the surface of a wafer of monocrystalline semiconducting material, forming a permanent insulating protective coating over the surface of said wafer with openings therethrough to separate semiconductor device elements, forming electrical contacts upon said coating in extension into ohmic engagement with separate semiconductor device elements through openings in said coating, covering said contacts with a protective layer, inverting the wafer, and etching channels in said wafer from the back side thereof completely through the wafer and between the different device portions of the wafer.

4. The process of claim 3 wherein said channels are subsesquently filled with an insulating material which bonds to the material of the wafer to provide an integral unit with the semiconductor devices thereof electrically insulated from each other.

5. A process as set forth in claim 3, further defined by said wafer being formed of silicon and said protective coating being integral silicon oxide for maximum adherence to the wafer.

6. An improved process of manufacturing solid-state electronic circuits comprising forming a plurality of semiconductor devices in a single wafer of semiconducting material having PN junctions extending to a surface of said wafer and having an insulating protective coating upon said wafer surface at least over said rectifying junctions and extending between the devices, forming conductive electrical interconnections between regions of different ones of said devices adjacent said protective coating by the steps of forming openings in said insulating coating communicating with separate regions of the semiconductor devices in the wafer, depositing conductive electrical interconnections upon the surface of said wafer over said coating and extending through said openings into ohmic contact with said separate regions, and etching at least one channel entirely through the semiconducting material of said wafer from the opposite surface thereof, thereby providing electrical isolation between devices on opposite sides of said channel.

References Cited by the Examiner

UNITED STATES PATENTS

| | | | |
|---|---|---|---|
| 2,748,041 | 5/1956 | Leverenz | 148—33.2 |
| 2,981,877 | 4/1961 | Noyce | 317—235 |

JOHN F. CAMPBELL, *Primary Examiner.*

WILLIAM I. BROOKS, *Examiner.*